(12) United States Patent
Watanabe et al.

(10) Patent No.: US 9,012,864 B2
(45) Date of Patent: Apr. 21, 2015

(54) NEUTRON DETECTOR

(71) Applicants: Tokuyama Corporation, Yamaguchi (JP); National University Corporation Nagoya University, Aichi (JP); Tohoku University, Miyagi (JP)

(72) Inventors: Kenichi Watanabe, Aichi (JP); Yuya Kawabata, Aichi (JP); Atsushi Yamazaki, Aichi (JP); Akira Uritani, Aichi (JP); Tetsuo Iguchi, Aichi (JP); Kentaro Fukuda, Yamaguchi (JP); Noriaki Kawaguchi, Yamaguchi (JP); Sumito Ishizu, Yamaguchi (JP); Akira Yoshikawa, Miyagi (JP); Takayuki Yanagida, Miyagi (JP)

(73) Assignees: Tokuyama Corporation, Shunan-shi, Yamaguchi (JP); National University Corporation Nagoya University, Nagoya-shi Aichi (JP); Tohoku University, Sendai-shi, Miyagi (JP)

( * ) Notice: Subject to any disclaimer, the term of this patent is extended or adjusted under 35 U.S.C. 154(b) by 308 days.

(21) Appl. No.: 13/760,461

(22) Filed: Feb. 6, 2013

(65) Prior Publication Data
US 2013/0206996 A1 Aug. 15, 2013

(30) Foreign Application Priority Data

Feb. 14, 2012 (JP) ................. 2012-029364

(51) Int. Cl.
G01T 3/06 (2006.01)
C09K 11/77 (2006.01)
C30B 29/12 (2006.01)

(52) U.S. Cl.
CPC ............... *G01T 3/06* (2013.01); *C09K 11/7733* (2013.01); *C30B 29/12* (2013.01)

(58) Field of Classification Search
CPC ..... G01T 3/06; C09K 11/7733; C09K 11/645
USPC .................. 250/390.01–390.12, 269.1–269.8
See application file for complete search history.

(56) References Cited

U.S. PATENT DOCUMENTS

2010/0019160 A1* 1/2010 Wallace .................. 250/370.03
2010/0314550 A1 12/2010 Yoshikawa et al.

FOREIGN PATENT DOCUMENTS

| EP | 2 256 177 A1 | 12/2010 |
| WO | 2009/119378 A1 | 10/2009 |
| WO | 2012/011506 A1 | 1/2012 |

OTHER PUBLICATIONS

Wattecamps et al., "A 27 cm2 scintillator for alpha particle detection of some MeV with 28% energy- and 240 ps time-resolution," Nov. 1991, Nuclear Instruments and Methods in Physics Research Section A: Accelerators, Spectrometers, Detectors, and Associated Equipment, vol. 309, Issues 1-2. Abstract only.*

(Continued)

*Primary Examiner* — Kiho Kim
(74) *Attorney, Agent, or Firm* — Ladas & Parry LLP

(57) ABSTRACT

Provided is a scintillation neutron detector capable of measuring neutrons with precision even under a high amount of γ rays as background noise and excellent in neutron counting precision, the scintillation neutron detector comprising a neutron scintillator crystal containing $^6$Li, and the crystal having a specific surface area of no less than 60 cm$^2$/cm$^3$.

5 Claims, 7 Drawing Sheets

(56) References Cited

OTHER PUBLICATIONS

European Search Report; dated Jul. 30, 2013; Appln. No. 13154121.1-1559.

Y. Yamane, et al; "Measurement of the thermal and fast neutron flux in a research reactor with a Li and Th loaded optical fibre detector", Nuclear Instruments and Methods in Physics Research A 432, pp. 403-409, Issues 2-3, Aug. 11, 1999.

Tetsuro Matsumoto, et al; "New Idea of a Small-Sized Neutron Detector with a Plastic Fibre", Radiation Protection Dosimetry, vol. 146, No. 1-3, pp. 92.95; Advance Access publication Apr. 26, 2011.

E. Wattecamps, et al; "A 27 $cm^2$ scintillator for alpha particle detection of some MeV with 28% energy- and 240 ps time-resolution", Nuclear Instruments and Methods in Physics Research, vol. A309, pp. 209-217, Nov. 1991.

\* cited by examiner

NEUTRON DETECTOR

TECHNICAL FIELD

The present invention relates to a scintillation neutron detector having a neutron scintillator crystal. In specific, it relates to a novel scintillation neutron detector capable of measuring neutrons with precision even under a high amount of γ rays which can result in background noise.

BACKGROUND ART

The neutron detector is an elemental technology that supports the technology utilizing neutrons. Neutron detectors with higher performance are demanded, with the development of the technology utilizing neutrons in such fields as the medical field including boron neutron capture therapy, the academic research field including structural analysis by neutron diffraction, the non-destructive inspection field, and the security field including cargo inspection.

An important characteristic demanded of the neutron detectors is precision in counting neutrons (hereinafter "neutron counting precision"). The neutron counting precision is affected by various factors such as detection efficiency for neutrons and discrimination between neutrons and γ rays (which is hereinafter referred to as "n/γ discrimination"). The detection efficiency refers to a ratio of the number of neutrons counted by the detector, with respect to the number of neutrons incident upon the detector. If the detection efficiency is low, the absolute number of neutrons counted is small, therefore resulting in degradation of measurement precision. In addition, γ rays not only exist in natural radiation, but also are generated when neutrons hit a component of a neutron detecting system or hit an object to be inspected. Therefore, if the γ rays are mistakenly counted as the neutrons because of low n/γ discrimination, the neutron counting precision will degrade.

In general, a neutron capture reaction is utilized to detect neutrons since the neutrons have strong power to pass through a material without performing any interactions in the material. For example, a helium-3 detector has been known, which performs the detection by utilizing a proton and tritium generated by the neutron capture reaction between $^3$He and the neutron. This detector is a proportional counter filled with $^3$He gas, having high detection efficiency and being excellent in n/γ discrimination. However, there is a drawback that it is difficult to reduce the size of the detector, and therefore difficult to carry out measurement in a small area or a narrow space. Further, $^3$He is an expensive substance and is also limited in its amount.

Recently, a scintillation neutron detector having a neutron scintillator has been developed as an alternative to the helium-3 detector mentioned above. The neutron scintillator is a substance that emits light by interaction with neutrons incident thereon. Combining the neutron scintillator and a photodetector such as a photomultiplier tube can form the scintillation neutron detector. The above described various performances of the scintillation neutron detector utilizing the neutron scintillator depend on a constituent of the neutron scintillator. For example, if an isotope which exhibits high efficiency in the neutron capture reaction is contained in a high amount, detection efficiency for neutrons will improve. Examples of such an isotope are $^6$Li and $^{10}$B (see Patent Document 1).

In the scintillation neutron detector having the neutron scintillator, the photodetector detects light emitted from the neutron scintillator and outputs a pulse signal. In general, the number of neutrons is measured by strength of the pulse signal, so called a pulse height value. That is, with a predetermined threshold given for the pulse height value, an event showing a pulse height value exceeding the threshold is counted as incidence of neutrons, and an event showing a pulse height value not reaching the threshold is treated as noise.

In addition, a scintillation neutron detector having a neutron scintillator and a photodetector linked by an optical fiber (hereinafter referred to as an optical fiber-type scintillation neutron detector) has been developed as an application of the scintillation neutron detector having the neutron scintillator. In the optical fiber-type scintillation neutron detector, scintillation light generated by the neutron scintillator is transmitted by the optical fiber to the photodetector.

There has been an attempt to use a mixed powder of LiF containing $^6$Li and Ag-doped ZnS being a fluorescent material (hereinafter referred to as LiF/ZnS), or a glass scintillator containing $^6$Li (hereinafter referred to as a Li glass), as the neutron scintillator in the optical fiber-type scintillation neutron detector (see Non-Patent Documents 1 and 2).

Since the optical fiber-type scintillation neutron detector described above is suitable for measuring neutrons in a small area or a narrow space, it is utilized as a neutron monitor for boron neutron capture therapy (BNCT) or as a neutron monitor in a nuclear reactor.

CITATION LIST

Patent Literature

Patent Document 1: International Publication No. 2009/119378

Non-Patent Literature

Non-Patent Document 1: Y. Yamane, et al., "Measurement of the thermal and fast neutron flux in a research reactor with a Li and Th loaded optical fibre detector", Nuclear Instruments and Methods in Physics Research A 432 (1999) pp. 403-409.

Non-Patent Document 2: Tetsuro Matsumoto, et al., "New idea of a small-sized neutron detector with a plastic fibre", Radiation Protection Dosimetry 146 (2011) pp. 92-95.

SUMMARY OF INVENTION

Solution to Problem

Although the scintillation neutron detector having the neutron scintillator has advantages that it has high detection efficiency for neutrons and is easily reduced in size, it has drawbacks that it is sensitive to γ rays and poor in n/γ discrimination.

Further, using LiF/ZnS as the neutron scintillator causes a large variability in the pulse height value outputted in detection of neutrons as mentioned below, therefore resulting in low neutron counting precision.

On the other hand, using the Li glass as the neutron scintillator results in insufficient n/γ discrimination since the Li glass is also sensitive to γ rays.

The present invention has been made in order to solve the above problems, with an object to provide a scintillation neutron detector which is capable of measuring neutrons with good precision even under a high amount of γ rays which can result in background noise, and which exhibits excellent neutron counting precision.

Solution to the Problems

Adopting a neutron scintillator crystal containing $^6$Li to reduce the variability in the pulse height value outputted in detection of neutrons, the inventors conducted various studies to improve n/γ discrimination of a scintillation neutron detector having the neutron scintillator crystal. As a result, they discovered that n/γ discrimination can be improved and favorable neutron counting precision can be attained by configuring the neutron scintillator crystal into a shape that easily makes fast electrons excited by γ rays escape from the crystal to the outside thereof.

They also discovered that a scintillation neutron detector which exhibits favorable neutron counting precision and is suitably used in a small area or a narrow space can be obtained by linking the neutron scintillator crystal with a photodetector via an optical fiber in the scintillation neutron detector; and have completed the present invention.

In specific, the present invention provides a scintillation neutron detector having a neutron scintillator crystal containing $^6$Li, the crystal having a specific surface area of no less than 60 cm$^2$/cm$^3$.

Additionally, in the present invention, the scintillation neutron detector further has: a photodetector; and an optical fiber linking the neutron scintillator crystal and the photodetector.

Effects of the Invention

According to the present invention, a scintillation neutron detector excellent in neutron counting precision can be provided. The scintillation neutron detector can measure neutrons with good precision even under a high amount of γ rays which can result in background noise. Further, the scintillation neutron detector of the present invention having the photodetector and the optical fiber linking the neutron scintillator crystal and the photodetector is suitable for measuring neutrons in a small area or a narrow space, and therefore can be favorably employed as a neutron monitor for boron neutron capture therapy (BNCT) or a neutron monitor in a nuclear reactor.

MODES FOR CARRYING OUT THE INVENTION

The scintillation neutron detector of the present invention has a neutron scintillator crystal containing (hereinafter, the crystal being referred to as a Li-6 crystal). With the Li-6 crystal, variability in the pulse height value outputted in detection of neutrons can be reduced, therefore enabling improvement of neutron counting precision.

In the neutron scintillator crystal made of the Li-6 crystal, an α ray and a tritium are generated by a neutron capture reaction between lithium-6 and neutrons, and apply an energy of 4.8 MeV to the neutron scintillator crystal. The energy applied is constant in each event of neutron incidence; and therefore, variability can be decreased in the amount of light emitted from the neutron scintillator crystal and in the pulse height value outputted by the photodetector detecting the light.

Figure 1:
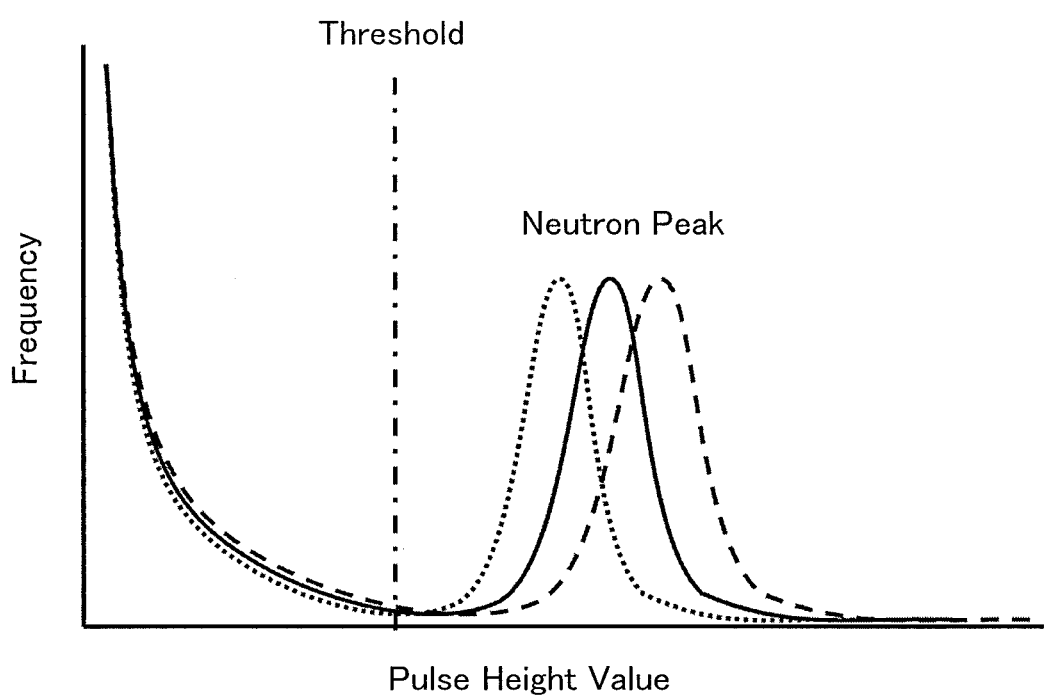
FIG. 1 is a diagrammatic presentation of a pulse height distribution spectrum obtained by the scintillation neutron detector of the present invention.
Figure 2:
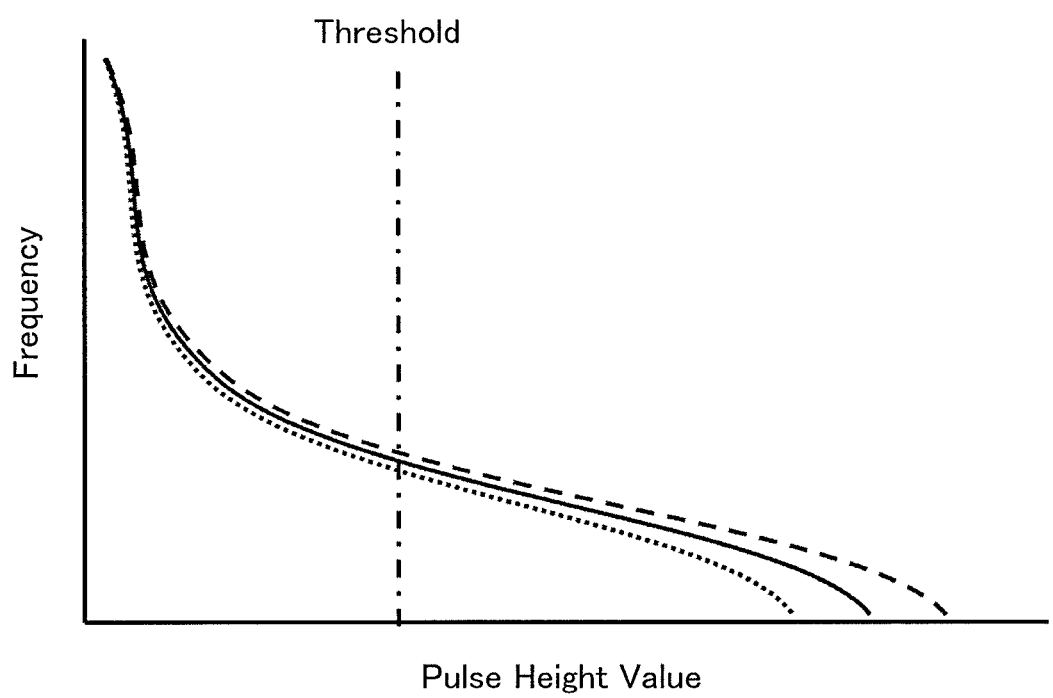
FIG. 2 is a diagrammatic presentation of a pulse height distribution obtained by a scintillation neutron detector comprising a mixture of a $^6$Li-containing compound and a fluorescent compound, as a neutron scintillator.
Figure 3:
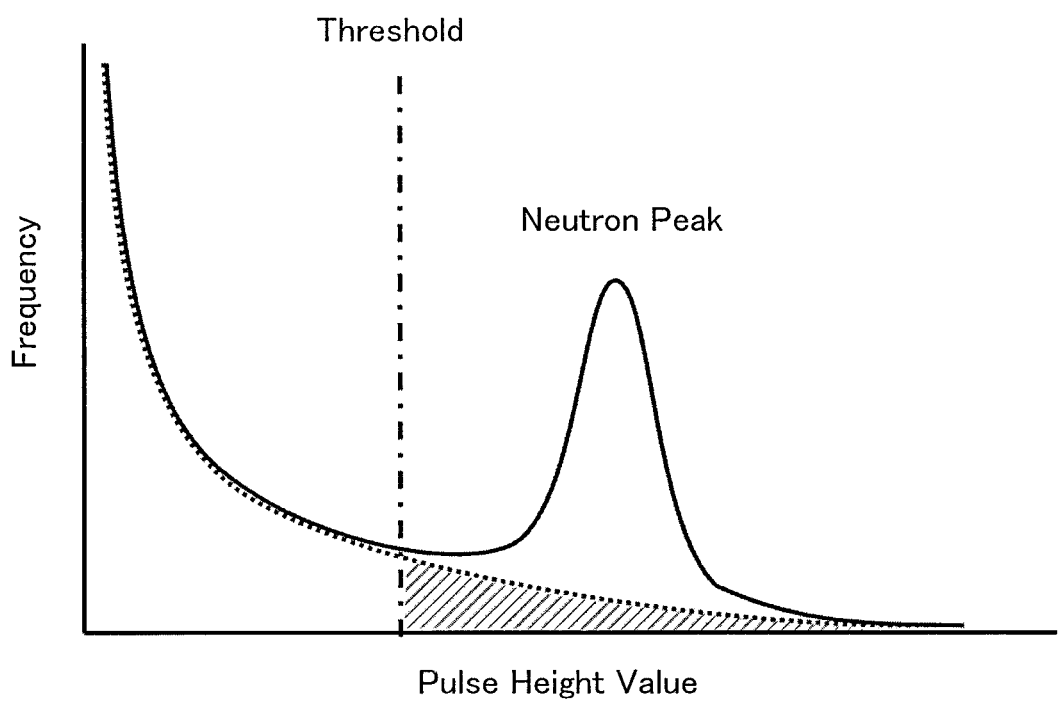
FIG. 3 is a diagrammatic presentation of a pulse height distribution spectrum obtained by a scintillation neutron detector comprising a conventional $^6$Li-containing crystal, as a neutron scintillator.

Advantageous effects attained by decrease in the variability in the pulse height value will be described with reference to FIGS. 1 to 3. FIGS. 1 to 3 respectively show a pulse height distribution spectrum in which the pulse height value is given in the horizontal axis, and the frequency of an event showing each pulse height value is given in the vertical axis.

FIG. 1 is a diagrammatic presentation of a pulse height distribution spectrum obtained by the scintillation neutron detector of the present invention. When the Li-6 crystal is employed as the neutron scintillator, an energy of 4.8 MeV is always applied as mentioned above. Therefore, a peak is formed at a position of the pulse height value corresponding to 4.8 MeV, as shown by a solid line in FIG. 1 (hereinafter, the peak being referred to as a neutron peak). The slope positioned at a low pulse height value indicates γ ray-induced noise or electrical noise, and is sufficiently separated from the neutron peak by employing the neutron scintillator crystal having a shape defined in the present invention, descriptions of the shape being given below. Accordingly, the above described threshold for the pulse height value can be easily set at a position defined by the dot-dash line in FIG. 1, for example.

Herein, the pulse height value often fluctuates in the scintillation neutron detector due to such factors as fluctuation in the light emission amount of the neutron scintillator caused by fluctuation of the ambient temperature, and fluctuation in the gain of the photodetector. The pulse height distribution spectrum showing increase and decrease of the pulse height value is given in FIG. 1, as indicated by the dashed line and the dotted line, respectively. As shown in FIG. 1, even when there is fluctuation in the pulse height value, there are few errors in the neutron count. In addition, it is also possible to further improve neutron counting precision by staying aware of the neutron peak and promptly modifying the above described threshold based on the position of the neutron peak.

Figure 4:
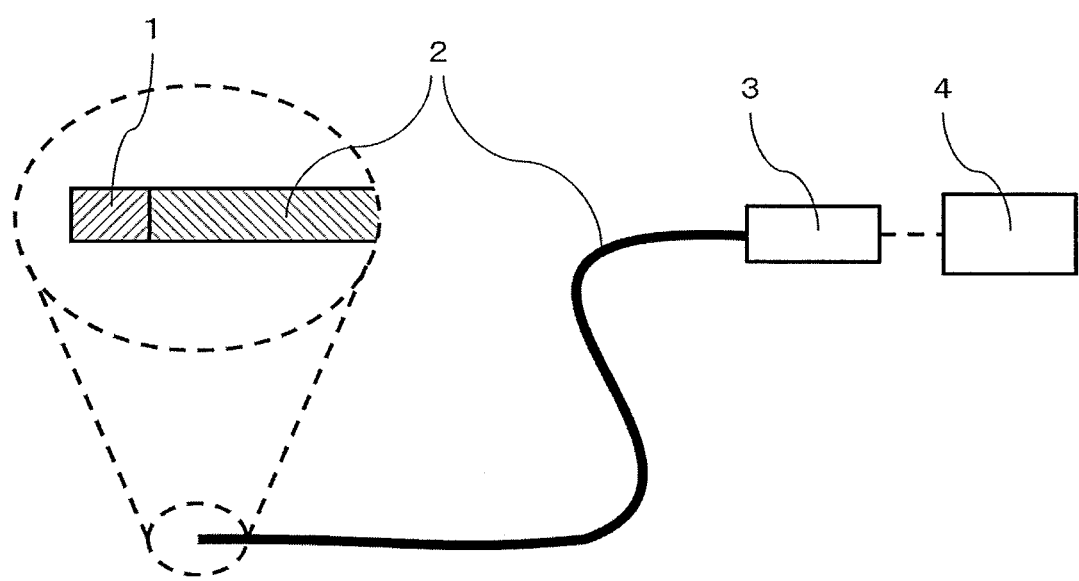
FIG. 4 is a schematic view of the optical fiber-type scintillation neutron detector of the present invention.

By contrast, in the case of employing, as the neutron scintillator, a mixture of a $^6$Li-containing compound and a fluorescent compound as represented by LiF/ZnS, even if it has the same shape as that of the neutron scintillator crystal in the present invention, the pulse height distribution spectrum is in the form of a slope as shown in FIG. 2 (also see FIG. 4-a in Non-Patent Document 1). In this case, there is no clear indication of incidence of neutron such as the neutron peak, and therefore it is very difficult to set the above described threshold for the pulse height value. Setting the threshold too high causes decrease in the neutron count, therefore resulting in degradation of detection efficiency. On the other hand, setting the threshold too low results in degradation of neutron counting precision because an event attributed to noise by γ rays or electrical noise is mixed in the neutron count.

Further, when the pulse height value fluctuates, neutron counting precision largely degrades. The pulse height distribution spectrum showing increase and decrease of the pulse height value is given in FIG. 2, as indicated by the dashed line and the dotted, respectively. It is impossible to know from the spectrum shown in FIG. 2 whether the changes in the pulse height distribution spectrum are caused by fluctuation in the light emission amount of the neutron scintillator or fluctuation in the gain of the photodetector, etc., or caused by fluctuation in the number of neutrons. Therefore, a large error occurs in the neutron count.

On the other hand, FIG. 3 is a diagrammatic presentation of a pulse height distribution spectrum obtained by a scintillation neutron detector having, as the neutron scintillator, a Li-6 crystal having a conventional shape (having a larger size and a smaller specific surface area). In the spectrum shown in FIG. 3, the slope (dotted line) attributed to incidence of γ rays reaches the pulse height value almost equal to that of the neutron peak. Therefore, the γ rays (shaded area) contributing to the pulse height value exceeding the threshold are counted as neutron, causing an error. Especially when there is a high amount of γ rays, the error caused by the γ rays increases, leading to a significant problem.

In the present invention, the Li-6 crystal may contain impurities or foreign substances as long as the requirement is met that a constant energy is always applied to the crystal by incidence of neutrons, as mentioned above.

Although a configuration of the Li-6 crystal may be monocrystal, polycrystal, ceramic, or the like, it is preferable for the Li-6 crystal to be monocrystal in order to form a neutron scintillator crystal which emits high amount of light without causing loss due to non-radiative transition attributed to a lattice defect or dissipation of scintillation light at the grain boundary of the crystal.

In the present invention, although a known Li-6 crystal may be employed without particular limitations, the amount of light emitted by the Li-6 crystal is preferably 1000 photons/neutron or more, and especially preferably 5000 photons/neutron or more. With a Li-6 crystal which emits large amount of light, the pulse height value attributed to incidence of neutrons largely exceeds the pulse height value attributed to electrical noise, thus making it possible to easily set the threshold described above and to improve the neutron counting precision. In the case of linking the neutron scintillator crystal and the photodetector by the optical fiber, the amount of light emitted by the Li-6 crystal is preferably 10000 photons/neutron or more, and especially preferably 20000 photons/neutron or more, in consideration of transmission loss of light in the optical fiber.

Specific examples of the Li-6 crystal include: Eu:LiCaAlF$_6$; Eu, Na:LiCaAlF$_6$; Eu:LiSrAlF$_6$; Ce:LiCaAlF$_6$; Ce,Na:LiCaAlF$_6$; Ce:LiSrAlF$_6$; Eu:LiI; Ce:Li$_6$Gd(BO$_3$)$_3$; Ce:LiCs$_2$YCl$_6$; Ce:LiCs$_2$YBr$_6$; Ce:LiCs$_2$LaCl$_6$; Ce:LiCs$_2$LaBr$_6$; Ce:LiCs$_2$CeCl$_6$; and Ce:LiRb$_2$LaBr$_6$.

A preferred configuration of the Li-6 crystal applicable in the present invention is, for an example, a metal fluoride crystal containing lithium, a metal element having a valence of 2 or higher, and fluorine as constituent elements, wherein the metal fluoride crystal contains 1.1 to 20 atoms per unit volume (atoms/nm$^3$) of $^6$Li, has an effective atomic number of 10 to 40, and contains a lanthanoid. In the present invention, the "effective atomic number" is an indicator $Z_{eff}$ defined by the formula (1) below.

[Formula 1]

$$X_{eff} = \left(\sum_i W_i Z_i^4\right)^{\frac{1}{4}} \quad (1)$$

(wherein, $W_i$ represents a mass fraction of the i-th element among the elements constituting the scintillator; and $Z_i$ represents an atomic number of the i-th element among the elements constituting the scintillator.)

Such a metal fluoride crystal can be produced, for an example, through the steps of: melting a material mixture composed of lithium fluoride in which an element ratio of $^6$Li isotope to the total lithium element is 20% or more, a fluoride of a metal element having a valence of 2 or higher (hereinafter sometimes referred to as a "host metal fluoride"), and a fluoride of lanthanoid, to obtain a material melt; and growing a single-crystal form from the material melt by a melt growth method.

Details of the method of producing the metal fluoride crystal are disclosed in WO 2009/119378 and corresponding US 2009/0314550 A1.

In the case of employing the metal fluoride crystal described above, a $^6$Li content per unit volume is preferably 1.1 atoms/nm$^3$ or more, and especially preferably 2.9 atoms/nm$^3$ or more in order to further improve neutron sensitivity. Further, it is preferably 20 atoms/nm$^3$ or less in view of production costs.

The above effective atomic number is preferably 40 or less, and especially preferably 30 or less in order to sufficiently reduce background noise attributed to γ rays. Further, it is preferably 10 or more in order to make production of the metal fluoride crystal easier. The effective atomic number, as defined in the above formula (1), takes the value specific to the chemical composition of the metal fluoride crystal, and therefore can be adjusted by selecting the composition of the metal fluoride crystal.

The metal element having a valence of 2 or higher in the above host metal fluoride may be selected from any metal elements that can form a fluoride crystal containing Li. However, in order to make the effective atomic number small, a typical metal element or a transition metal element having an atomic number of 56 or lower, more preferably 40 or lower can be favorably employed as the metal element having a valence of 2 or higher. Specific examples include: metal elements having a valence of 2, such as magnesium, calcium, strontium and barium; metal elements having a valence of 3, such as aluminum, scandium and yttrium; and metal elements having a valence of 4, such as zirconium. The host metal fluoride crystal containing a metal element selected from the metal elements having a valence of 2 to 4 is preferably employed in terms of ease of production. With a part of the metal element having a valence of 2 or higher replaced by a lanthanoid in the above metal fluoride crystal, the lanthanoid is incorporated into the crystal. The host metal fluoride crystal may contain only one metal element having a valence of 2 or higher, or may contain two or more metal element having a valence of 2 or higher. The host metal fluoride crystal may also contain a monovalent metal element other than lithium, such as sodium, potassium, rubidium, and cesium.

In the metal fluoride crystal, the lanthanoid fulfills a function mainly in light emission. The lanthanoid is not particularly limited; and it may be adequately selected from cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm) or ytterbium (Yb), based on a desired light emission wavelength, light emission intensity and light emission lifetime. A content of the lanthanoid in the above metal fluoride crystal is preferably 0.005 to 5 moles based on 100 mole of lithium constituting the metal fluoride crystal. In general, the higher the content of the lanthanoid in the above metal fluoride crystal is, the larger the light emission intensity is. However, if the content is too high, the light emission intensity tends to be attenuated by concentration quenching, and the background noise attributed to γ rays tends to increase because of increase in the effective atomic number explained above.

Another example of preferred configuration of the Li-6 crystal applicable in the present invention is a colquiriite-type crystal having a composition in which a metal halide with the composition represented by the following chemical formula (2) further contains one or more lanthanoid element. The metal halide is preferably a metal fluoride.

[Chemical Formula 1]

$$LiM^1M^2X_6 \qquad (2)$$

(wherein $M^1$ represents one or more alkaline earth metal element selected from the group consisting of Mg, Ca, Sr, and Ba; $M^2$ represents one or more metal element selected from the group consisting of Al, Ga, and Sc; and X represents one or more halogen element selected from the group consisting of F, Cl, Br, and I, preferably F.)

The colquiriite-type crystal has characteristics that it emits high amount of light, has short fluorescence lifetime and is suitable for high count rate operation. Non-limited specific examples of the colquiriite-type crystal that are especially preferred include: Ce:LiCaAlF$_6$; Ce:LiSrAlF$_6$; Eu:LiCaAlF$_6$; and Eu:LiSrAlF$_6$.

A colquiriite-type crystal having a composition in which a metal halide with the composition represented by the chemical formula (2) further contains one or more lanthanoid element and one or more alkali metal element, can also be preferably employed. Non-limited specific examples of such a colquiriite-type crystal include: Ce,Na:LiCaAlF$_6$; Ce,Na:LiSrAlF$_6$; Eu, Na: LiCaAlF$_6$; and Eu, Na: LiSrAlF$_6$.

Among the above examples of the Li-6 crystal, Eu:LiCaAlF$_6$; Eu,Na:LiCaAlF$_6$; Eu:LiSrAlF$_6$; and Eu,Na:LiSrAlF$_6$ are most preferred since it emits high amount of light and is chemically stable not being deliquescent.

A distinctive characteristic of the present invention is that the neutron scintillator crystal has a specific surface area of 60 cm$^2$/cm$^3$ or more. In the present invention, the specific surface area of the neutron scintillator crystal refers to a surface area per unit volume of the neutron scintillator crystal. According to the inventors' study, with the specific surface area of the neutron scintillator crystal of 60 cm$^2$/cm$^3$ or more, it is possible to reduce the pulse height value outputted upon incidence of γ rays on the neutron scintillator crystal, and therefore possible to easily discriminate between neutrons and γ rays by means of the above mentioned threshold set for the pulse height value.

In general, when γ rays come into the neutron scintillator crystal, fast electrons are produced inside the neutron scintillator crystal and apply energy to the neutron scintillator crystal, thereby causing the neutron scintillator crystal to emit light. If a pulse height value outputted by this light emission is almost as high as the pulse height value outputted by incidence of neutrons so that discrimination between the γ rays and the neutrons cannot be made, the γ rays will be counted as the neutrons, causing an error in the neutron count (as in FIG. 3 described above).

The pulse height value outputted from the scintillation neutron detector by the incidence of the γ rays depends on the energy applied by the fast electrons. Therefore, by decreasing the energy applied by the fast electrons, it is possible to decrease the pulse height value outputted upon incidence of the γ rays onto the neutron scintillator crystal.

One way of decreasing the energy to be applied to the neutron scintillator crystal by the fast electrons is to reduce the size of the neutron scintillator crystal. The reduced size of the neutron scintillator crystal allows the fast electrons to escape from the neutron scintillator crystal before all the energy of the fast electrons are applied, therefore enabling decrease in the energy applied to the neutron scintillator crystal by the fast electrons. However, the neutron scintillator crystal has various shapes such as a flat plate, a prism, a cylinder, and a sphere, depending on its purpose of use. The energy applied to the neutron scintillator crystal by the fast electrons also differs depending on the shape. Therefore, it is generally difficult to know how much of the size of the neutron scintillator crystal needs to be reduced to sufficiently decrease the pulse height value attributed to γ rays.

In the present invention, since the specific surface area is a surface area per unit volume, (1) the specific surface area tends to be larger as the absolute volume is smaller; and (2) when the shape is spherical, the specific surface area is smallest. On the other hand, as the specific surface area of an object becomes larger, the shape of the object is farther from the spherical shape. Taking as an example a cuboid having sides extending in an X-axis direction, Y-axis direction, and Z-axis direction, respectively, a regular hexahedron with X=Y=Z has the smallest specific surface area. When a length in one of the axis directions is reduced and a side in another axis direction is elongated, the specific surface area is larger even if the volume is the same.

More specifically, the specific surface area of a regular hexahedron having each side in 1 cm is 6 cm$^2$/cm$^3$. However, the specific surface area of a regular hexahedron having each side in 0.5 cm (0.125 cm$^3$) is 12 cm$^2$/cm$^3$. Further, when the thickness is 0.03125 cm with the same volume (0.125 cm$^3$), the length and width becomes 2 cm×2 cm, therefore resulting in a specific surface area of 66 cm$^2$/cm$^3$.

In other words, having a large specific surface area means having a very small length in at least one of the axis directions. Since fast electrons excited by γ rays and travelling in this small-length axis direction or in a direction close to this axis direction escape from the crystal promptly as described above, it is possible to decrease the energy applied to the neutron scintillator crystal by the fast electrons.

The present invention has been made in view of the above findings and considerations, and according to the inventors' study, the specific surface area can be used to evaluate the energy applied to the neutron scintillator crystal by the fast electrons, as an indicator of the crystal size in consideration of the possibility that the neutron scintillator crystal has various shapes. In practice, with the specific surface area of the neutron scintillator crystal being no less than 60 cm$^2$/cm$^3$, it is possible to obtain a scintillation neutron detector capable of measuring neutrons with good precision even under a high amount of γ rays which can result in background noise.

In the present invention, although the upper limit of the above specific surface area is not particularly limited, it is preferably no more than 500 cm$^2$/cm$^3$. If the specific surface area exceeds 500 cm$^2$/cm$^3$, that is, if the lengths of the neutron scintillator crystal in all the axis directions are extremely small, α rays and tritium generated by a neutron capture reaction of $^6$Li and neutrons may escape from the neutron scintillator crystal before applying an energy of 4.8 MeV to the neutron scintillator crystal. If this occurs frequently, the neutron peak as described above will not be formed, therefore likely causing degradation of neutron detection precision. In order to obtain a clear neutron peak, it is especially preferable to make the specific surface area of the neutron scintillator crystal to be no more than 200 $cm^2/cm^3$.

The term "axis", which is used in the descriptions above, is used only for convenience to indicate the spatial coordinate position of X, Y, and Z. Therefore, the neutron scintillator crystal employed in the present invention is not limited to a cuboid or a cube having sides in these particular axis directions, as a matter of course.

In the present invention, the shape of the neutron scintillator crystal is not particularly limited as long as the neutron scintillator crystal has a specific surface area in the range specified above. A shape suited for combination with the photodetector or the optical fiber may be adequately selected. In specific, a neutron scintillator crystal may be employed which has such shapes as a plate shape having a thickness of several hundred micrometers; a prism shape having each side in several hundred micrometers; a columnar shape having a diameter of several hundred micrometers; and a spherical shape having a diameter of several hundred micrometers. A specific value referred to by the "several hundred micrometers" may be 100 to 700 μm, preferably 200 to 500 μm.

The scintillation neutron detector of the present invention is formed by a combination of the neutron scintillator crystal and the photodetector. That is, light emitted from the neutron scintillator crystal by incidence of neutrons is converted into an electrical signal, and thereby the incidence of the neutrons is measured in the form of the electrical signal. As such, the scintillation neutron detection can be used for counting neutrons, and the like. In the present invention, the photodetector is not particularly limited; and thus, known photodetectors such as a photomultiplier tube (hereinafter referred to as "PMT") and a photodiode may be employed without particular limitations.

Preferably, the neutron scintillator crystal has a light output face facing the photodetector and the light output face is given optical polishing. With the light output face provided on the neutron scintillator crystal, the light generated in the neutron scintillator crystal can enter the photodetector efficiently. Further, giving a light reflection film made of aluminum or polytetrafluoroethylene to faces not facing the photodetector can prevent dissipation of the light generated in the neutron scintillator crystal.

A method of making the scintillation neutron detector by combining the neutron scintillator crystal and the photodetector of the present invention is not particularly limited. The scintillation neutron detector may be made for example by: optically adhering the light output face of the neutron scintillator crystal to a light detection face of the photodetector by means of an optical grease, an optical cement, or the like; and connecting a power source and a signal read-out circuit to the photodetector. The signal read-out circuit is generally constituted by a preamplifier, a shaping amplifier, a multichannel pulse height analyzer, or the like.

Further, a multi-array of neutron scintillator crystals given the light reflection film and adoption of a position sensitive photodetector as the photodetector enable the scintillation neutron detector to have a positional resolution capability.

Linking the neutron scintillator crystal and the photodetector via the optical fiber can make an optical fiber-type scintillation neutron detector. The optical fiber-type scintillation neutron detector is not only excellent in neutron counting precision, but can also be favorably employed in measuring neutrons in a small area or a narrow space.

FIG. 4 schematically shows the optical fiber-type scintillation neutron detector. In the optical fiber-type scintillation neutron detector, light emitted from the neutron scintillator crystal (1) travels through the optical fiber (2) to reach the photodetector (3), and is converted into an electrical signal by the photodetector (3).

A method of making the optical fiber-type scintillation neutron detector of the present invention is not particularly limited. It can be made in the same manner as described above, except for optically adhering the neutron scintillator crystal with the optical fiber, and optically adhering the optical fiber with the photodetector. In addition, the same photodetector and signal read-out circuit as described above may be used.

The optical fiber employed in the optical fiber-type scintillation neutron detector of the present invention is not particularly limited; and a known optical fiber may be used. Especially preferred in view of light transmission efficiency is an optical fiber having a so-called core-clad structure, in which the core is surrounded by a material having a refractive index lower than that of the core. Further, a material of the optical fiber is not particularly limited; and may be a plastic material such as a fluorine-based polymer, polycarbonate and polystyrene, or a glass material such as a quartz glass. Especially when the optical fiber is used under a high amount of neutrons or γ rays, a quartz glass fiber is preferably employed in view of radiation resistance.

EXAMPLES

Examples of the present invention will be given to describe the present invention in more detail; however, the present invention is not limited to these Examples. Further, the combinations of the features given in Examples are not necessarily requisite for the solution to the problems presented by the present invention.

Example 1

In the present Example, an $Eu:LiCaAlF_6$ single crystal being a Li-6 crystal was used as the neutron scintillator crystal, to make a scintillation neutron detector. The $Eu:LiCaAlF_6$ single crystal was plate-shaped having a size of 10 mm×10 mm×0.3 mm and a specific surface area of 71 $cm^2/cm^3$. The light emission amount of the $Eu:LiCaAlF_6$ single crystal was 25000 photons/neutron. So as to use a 10 mm×10 mm face of the $Eu:LiCaAlF_6$ single crystal as a light output face, the face was subjected to optical polishing.

First, a tape-like polytetrafluoroethylene was applied to the faces of the neutron scintillator crystal except for the light output face, to form a light reflection film. Then, with a PMT (R7600U manufactured by Hamamatsu Photonics K.K.) employed as the photodetector, a light detection face of the PMT and the light output face of the neutron scintillator crystal were optically adhered to each other by an optical grease.

A power source and a signal read-out circuit were connected to the PMT. Thereby, a neutron detector was made. Herein, as the signal read-out circuit, a preamplifier, a shaping amplifier, and a multichannel analyzer were connected in the mentioned order from the PMT side.

After the neutron detector was covered with a black light-shielding sheet, neutrons from Cf-252 having a radioactivity of about 1 MBq were irradiated, while decelerated by a 40 mm-thick polyethylene block.

With the power source connected to the PMT, a high voltage of 600 V was applied to the PMT. A light emission pulse generated in the neutron scintillator crystal by incidence of the neutrons was converted into a pulsed electrical signal in the PMT; and the electrical signal was inputted into the multichannel analyzer via the preamplifier and the shaping amplifier. The electrical signal inputted into the multichannel analyzer was analyzed to form a pulse height distribution spectrum.

Next, a pulse height distribution spectrum was formed in the same manner as above, except that γ rays from Co-60 having a radioactivity of about 1 MBq were irradiated instead of neutrons.

Figure 5:
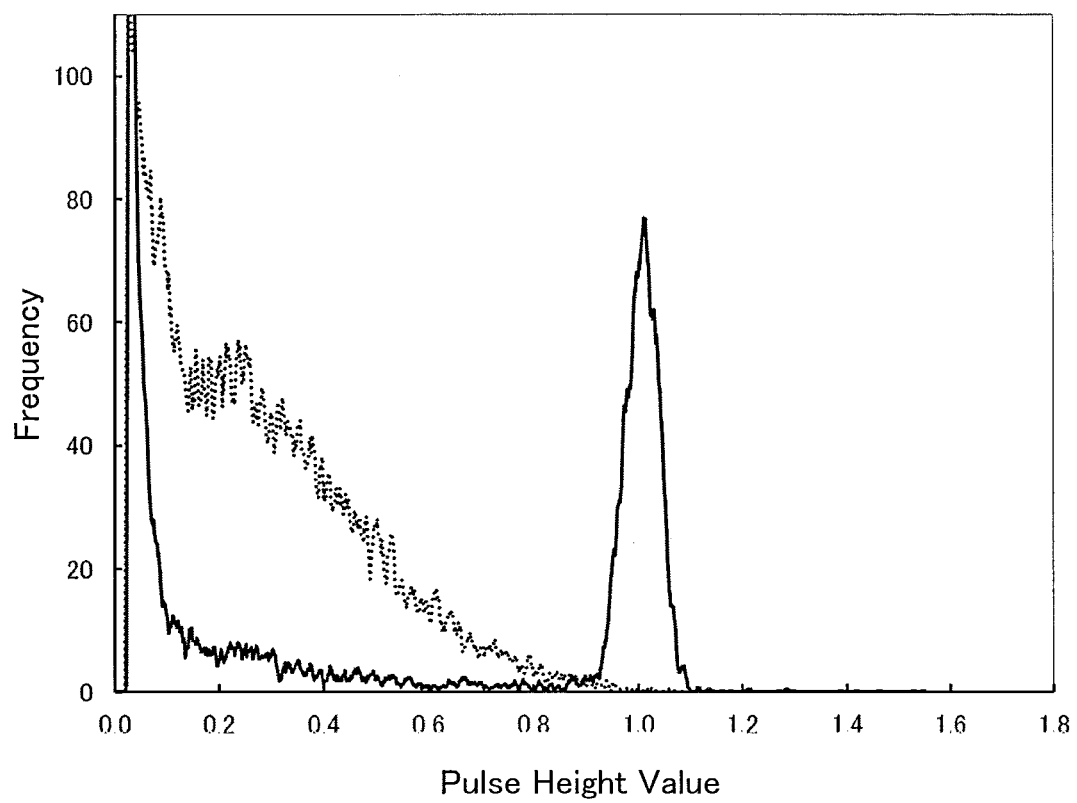
FIG. 5 is a pulse height distribution spectrum obtained in Example 1.

The pulse height distribution spectra obtained are shown in FIG. 5. The solid line and the dotted line in FIG. 5 represent the pulse height distribution spectra under irradiation of the neutrons and the γ rays, respectively. In the pulse height distribution spectra, the pulse height value is given in the horizontal axis in a relative value, with the pulse height value at a neutron peak as 1.

It can be seen from FIG. 5 that: there is a clear neutron peak; the pulse height value of the electrical signal generated by incidence of the γ rays was far lower than the pulse height value of the neutron peak; and therefore the γ rays and the neutrons can be easily discriminated.

Comparative Example 1

A scintillation neutron detector was made in the same manner as in Example 1, except that an Eu:LiCaAlF$_6$ single crystal in a plate shape having a size of 10 mm×10 mm×1 mm and a specific surface area of 24 cm$^2$/cm$^3$ was used as a neutron scintillator crystal; and pulse height spectra under irradiation of neutrons and γ rays were formed.

Figure 6:
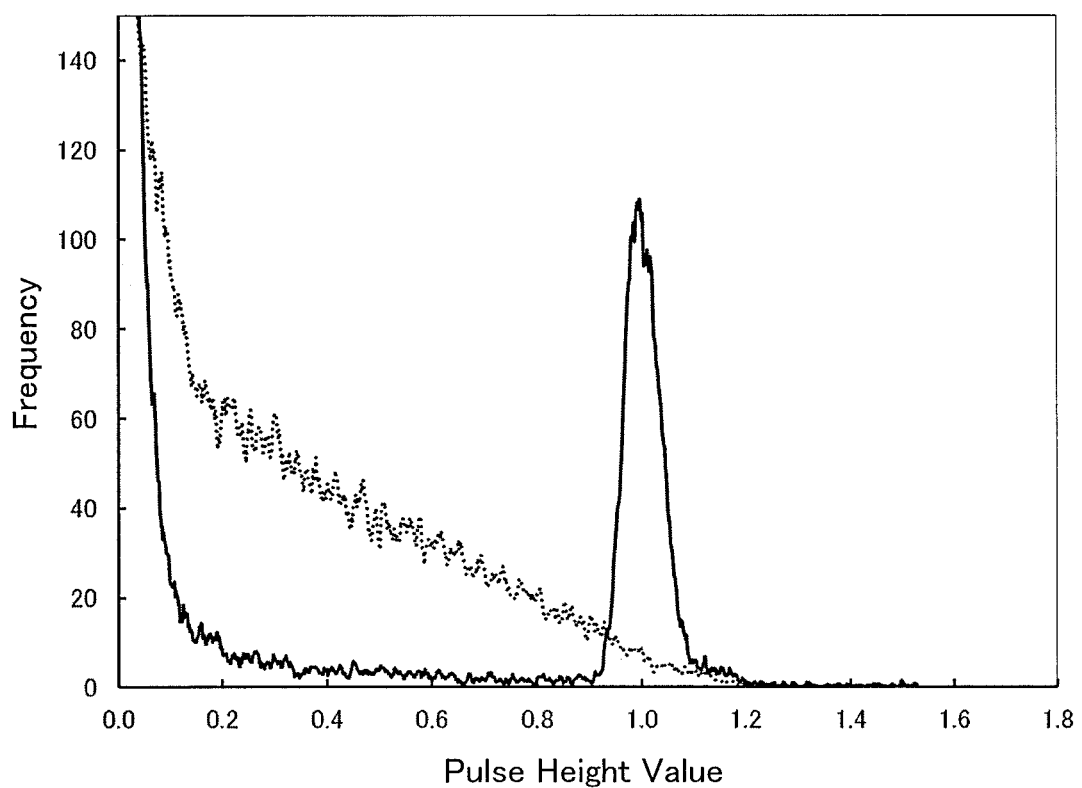
FIG. 6 is a pulse height distribution spectrum obtained in Comparative Example 1.

The pulse height distribution spectra obtained are shown in FIG. 6. The solid line and the dotted line in FIG. 6 represent the pulse height distribution spectra under irradiation of the neutrons and the γ rays, respectively. In the pulse height distribution spectra, the pulse height value is given in the horizontal axis in a relative value, with the pulse height value at a neutron peak as 1.

It can be understood from FIG. 6 that: although there is a clear neutron peak, the pulse height value of the electrical signal generated by incidence of γ rays partially overlaps with the pulse height value at the neutron peak; and therefore, discrimination between the γ rays and the neutrons is difficult to make.

Example 2

In the present Example, an Eu,Na:LiCaAlF$_6$ single crystal being a Li-6 compound was used as the neutron scintillator crystal, to make a scintillation neutron detector. The Eu,Na:LiCaAlF$_6$ single crystal was in a columnar shape having a diameter of 0.3 mm, a length of 0.4 mm, and a specific surface area of 180 cm$^2$/cm$^3$. The light emission amount of the Eu,Na:LiCaAlF$_6$ single crystal was 30000 photons/neutron.

Figure 7:
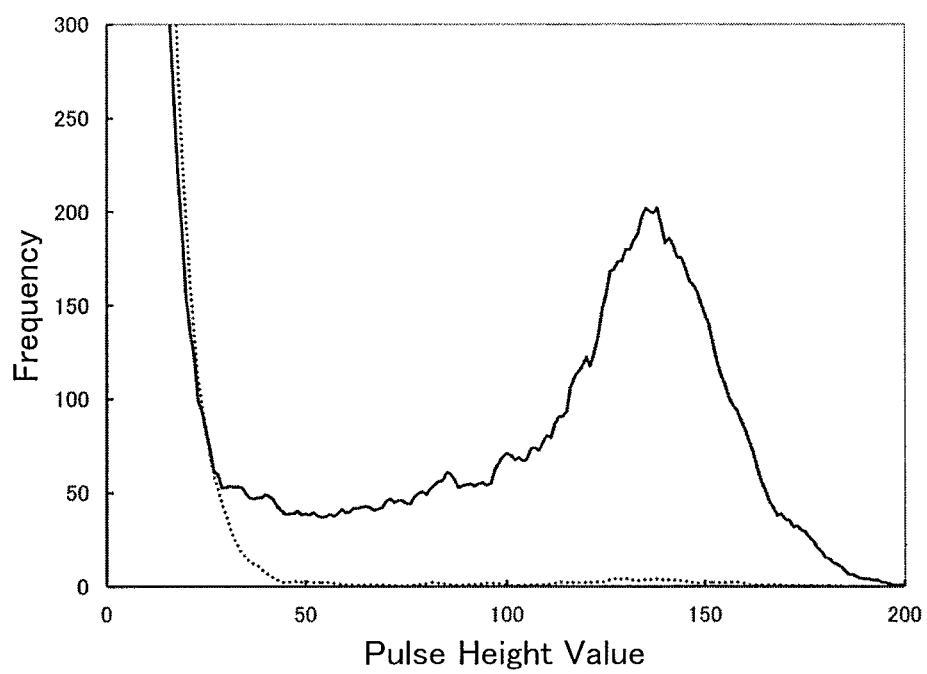
FIG. 7 is a pulse height distribution spectrum obtained in Example 2.

A plastic optical fiber having a core diameter of 500 μm and a length of 2 m was used to optically adhere the Eu,Na:LiCaAlF$_6$ single crystal to one end of the optical fiber, and to optically adhere a light detection face of a PMT (H6612 manufactured by Hamamatsu Photonics K.K.) as a photodetector to the other end of the optical fiber, respectively by an optical grease. A tape-like polytetrafluoroethylene, as a reflection material, was applied around the Eu,Na:LiCaAlF$_6$ single crystal; and light was shielded by an aluminum foil. With a preamplifier (ORTEC 113) and a linear amplifier (ORTEC 572) connected to the latter stage of the PMT, an electrical signal processed was inputted into a multichannel analyzer, and a pulse height distribution spectrum was obtained. The pulse height distribution spectrum is shown by a solid line in FIG. 7. In addition, a pulse height distribution spectrum is shown by a broken line in FIG. 7, which was obtained when the neutron scintillator crystal was covered with a Cd plate as a neutron shielding material in order to remove influence by neutrons. When neutrons were shielded by the Cd plate, γ rays reaching the pulse height value at the neutron peak were hardly detected in spite of a high amount of γ rays present. It can be understood from this that only neutrons were selectively detected.

DESCRIPTION OF THE REFERENCE NUMERALS 1 neutron scintillator crystal
2 optical fiber
3 photodetector
4 signal read-out circuit

The invention claimed is:
1. A scintillation neutron detector comprising:
   a neutron scintillator crystal containing $^6$Li, said crystal having a specific surface area of no less than 60 cm$^2$/cm$^3$.
2. The scintillation neutron detector according to claim 1, further comprising:
   a photodetector; and
   an optical fiber linking the neutron scintillator crystal and the photodetector.
3. The scintillation neutron detector according to claim 1, which is a neutron monitor for boron neutron capture therapy.
4. The scintillation neutron detector according to claim 1 wherein the specific surface area of the neutron scintillator crystal is no more than 500 cm$^2$/cm$^3$.
5. The scintillation neutron detector according to claim 1, wherein the neutron scintillator crystal is a metal fluoride crystal containing lithium, a metal element having a valence of 2 or higher, and fluorine as constituent elements,
   and wherein said metal fluoride crystal contains 1.1 to 20 atoms per unit volume (atoms/nm$^3$) of $^6$Li, has an effective atomic number of 10 to 40, and contains a lanthanoid.

* * * * *